(12) United States Patent
Wu (10) Patent No.: US 6,881,590 B2
(45) Date of Patent: Apr. 19, 2005

(54) RE-PERFORMABLE SPIN-ON PROCESS

(75) Inventor: Ching-Hsiu Wu, Chang-Hua (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 10/604,895

(22) Filed: Aug. 25, 2003

(65) Prior Publication Data

US 2005/0048760 A1 Mar. 3, 2005

(51) Int. Cl.$^7$ ............................................. H01L 21/473
(52) U.S. Cl. ............................ 438/4; 438/14; 438/782; 438/788
(58) Field of Search ............................. 438/4, 14, 623, 438/763, 780, 782, 788

(56) References Cited

U.S. PATENT DOCUMENTS

| | | | | |
|---|---|---|---|---|
| 6,207,556 B1 | * | 3/2001 | Hsu | ............................ 438/637 |
| 6,242,355 B1 | * | 6/2001 | Hu et al. | .................... 438/699 |
| 6,319,330 B1 | * | 11/2001 | Jiang et al. | ..................... 134/2 |
| 2002/0081758 A1 | * | 6/2002 | Iriki | ............................. 438/16 |
| 2002/0197749 A1 | * | 12/2002 | Knight et al. | ................. 438/14 |

OTHER PUBLICATIONS

Stanley Wolf and Richard N. Tauber, "Silicon Processing for the VLSI Era—vol. 1: Process Technology," Lattice Press, Sunset Beach, California, 1986, pp. 429–434, 518–520.*

* cited by examiner

Primary Examiner—Stephen W. Smoot
(74) Attorney, Agent, or Firm—Winston Hsu (57) ABSTRACT

First, a spin-on process is performed for forming a first dielectric layer over a plurality of metal interconnecting wires that are located on a semiconductor wafer. Then, an examining step is performed on the first dielectric layer, and the first dielectric layer is made to conform to a predetermined condition. Thereafter, an etching process is performed for completely removing the first dielectric layer. Subsequently, the semiconductor wafer is cleaned through use of a wet scrubber, and is dried. Finally, the spin-on process is re-performed for forming a second dielectric layer on the semiconductor wafer.

15 Claims, 10 Drawing Sheets

RE-PERFORMABLE SPIN-ON PROCESS

BACKGROUND OF INVENTION

1. Field of the Invention

The present invention relates to a spin-on process, and more specifically, to a re-performable spin-on process capable of reducing instances of scrapped semiconductor wafers.

2. Description of the Prior Art

In a multilevel metallization process, metallic conductive layers and low-k dielectric layers connect each of the metal oxide semiconductor (MOS) transistors on a semiconductor wafer to form a stacked circuit structure. Since the multilevel metallization process improves the integration of the semiconductor wafer, it is therefore commonly applied to very large scale integration (VLSI) processes. Additionally, for depositing a void-free dielectric layer with good step coverage ability on the metallic conductive layers, a sandwich-type dielectric structure is always available to the VLSI processes.

Figure 1:
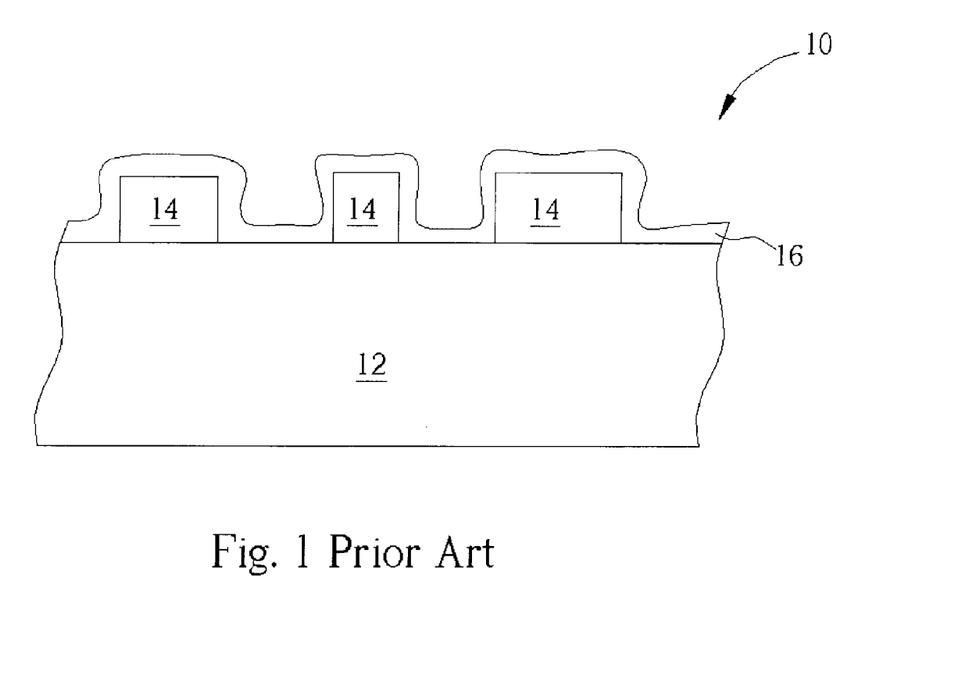
FIG. 1 to FIG. 4 are schematic diagrams for illustrating forming a sandwich-type dielectric structure on a semiconductor wafer according to the prior art.
Figure 2:
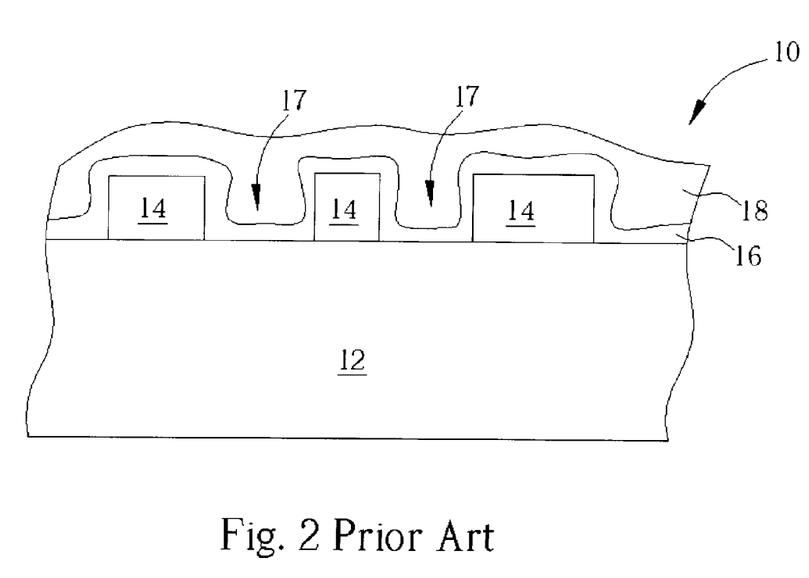
Figure 3:
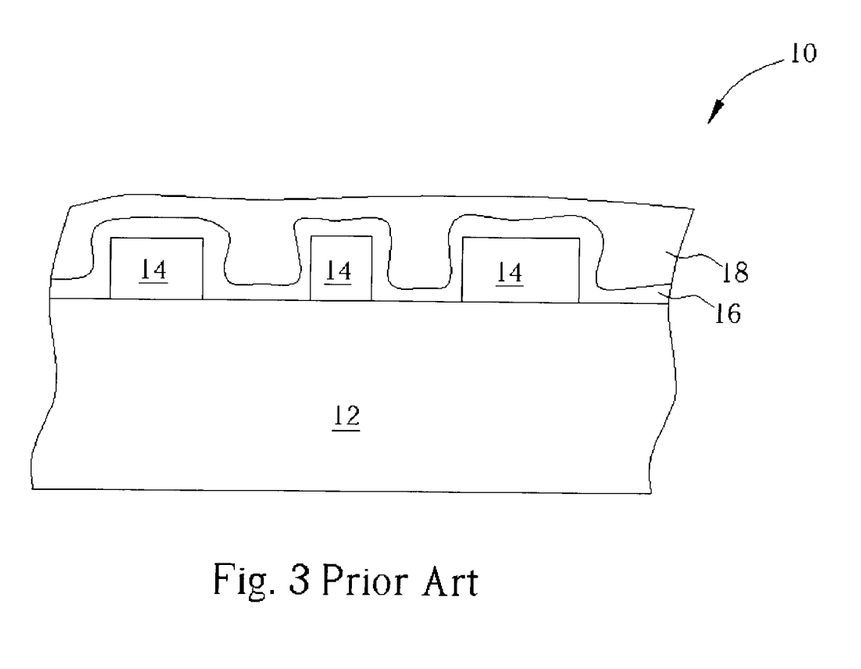
Figure 4:
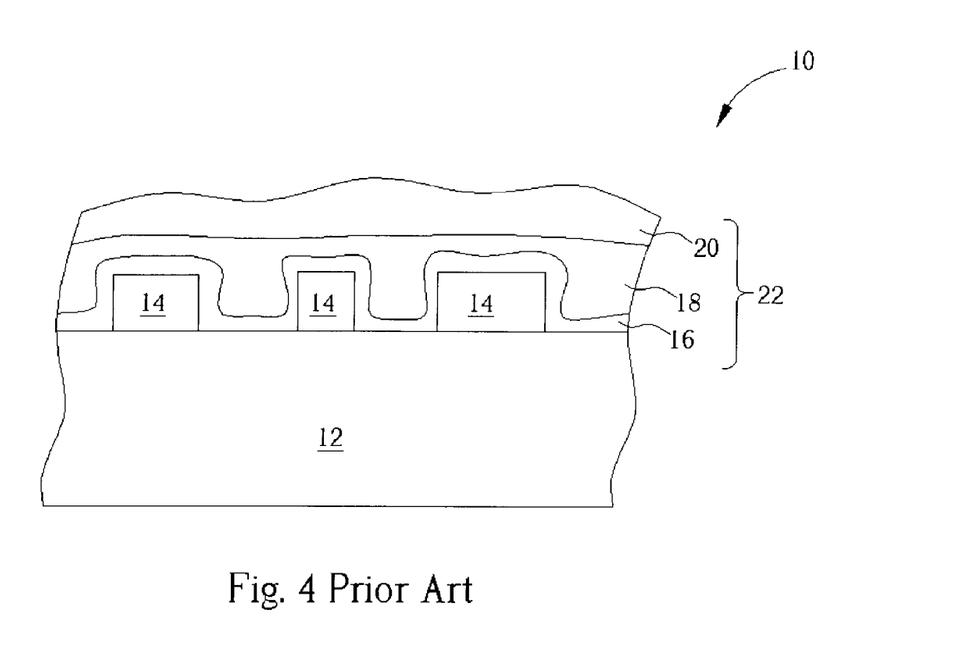

Please refer to FIG. 1 to FIG. 4. FIG. 1 to FIG. 4 are schematic diagrams for illustrating forming a sandwich-type dielectric structure 22 on a semiconductor wafer 10. As shown in FIG. 1, the semiconductor wafer 10 includes a silicon substrate 12, a plurality of metal interconnecting wires 14, and a silicon dioxide layer 16 formed on the semiconductor wafer 10. Additionally, the silicon dioxide layer 16 is formed through performing a plasma enhanced chemical vapor deposition (PECVD) process. Then, a spin-on process is performed for forming a spin-on glass (SOG) layer 18 on the semiconductor wafer 10, the SOG layer 18 filling trenches 17 in the silicon dioxide layer 16, as shown in FIG. 2. Subsequently, after a curing process is performed on the SOG layer 18, an etching back process is performed for partially removing the SOG layer 18 so as to reduce a thickness of the SOG layer 18, as shown in FIG. 3. Finally, as shown in FIG. 4, a PECVD process is performed for depositing a silicon dioxide layer 20 on the SOG layer 18, thereby completing the fabrication of the sandwich-type dielectric structure 22.

Since the line width of the semiconductor process is gradually shrinking, the width of each metal interconnecting wire 14 gets smaller and smaller. However, for maintaining a low resistance of each metal interconnecting wire 14, a thickness of each metal interconnecting wire 14 cannot be reduced without restriction so that each metal interconnecting wire 14 has a high aspect ratio and a severe topography. Therefore, the SOG layer 18 always has poor thickness uniformity. In addition, after the spin-on process is completed, an edge bevel rinse (EBR) process is usually performed for cleaning an edge of the semiconductor wafer 10, and the EBR process may cause the semiconductor wafer 10 to be contaminated by chemical solutions. Conventionally, when the SOG layer 18 has poor thickness uniformity or is contaminated by chemical solutions, the semiconductor wafer 10 is immediately scrapped, thus wasting resources and increasing production costs.

SUMMARY OF INVENTION

It is therefore a primary objective of the claimed invention to provide a re-performable spin-on process in order to solve the above-mentioned problem.

According to the claimed invention, a re-performable spin-on process is provided. In there-performable spin-on process, a spin-on process is first performed for forming a first dielectric layer over a plurality of metal interconnecting wires that are located on a semiconductor wafer. Then, an examining step is performed on the first dielectric layer, and the first dielectric layer is made to conform to a predetermined condition. Thereafter, an etching process is performed for completely removing the first dielectric layer. Subsequently, the semiconductor wafer is cleaned through use of a wet scrubber, and is dried. Finally, the spin-on process is re-performed for forming a second dielectric layer on the semiconductor wafer.

It is an advantage over the prior art that the claimed invention provides a re-performable spin-on process. Thus, the claimed invention can prevent the semiconductor wafer from being scrapped due to failure of the spin-on process, and therefore can increase a production yield of a semiconductor device.

These and other objectives of the claimed invention will no doubt become obvious to those of ordinary skill in the art after reading the following detailed description of the preferred embodiment, which is illustrated in the multiple figures and drawings.

DETAILED DESCRIPTION

Figure 5:
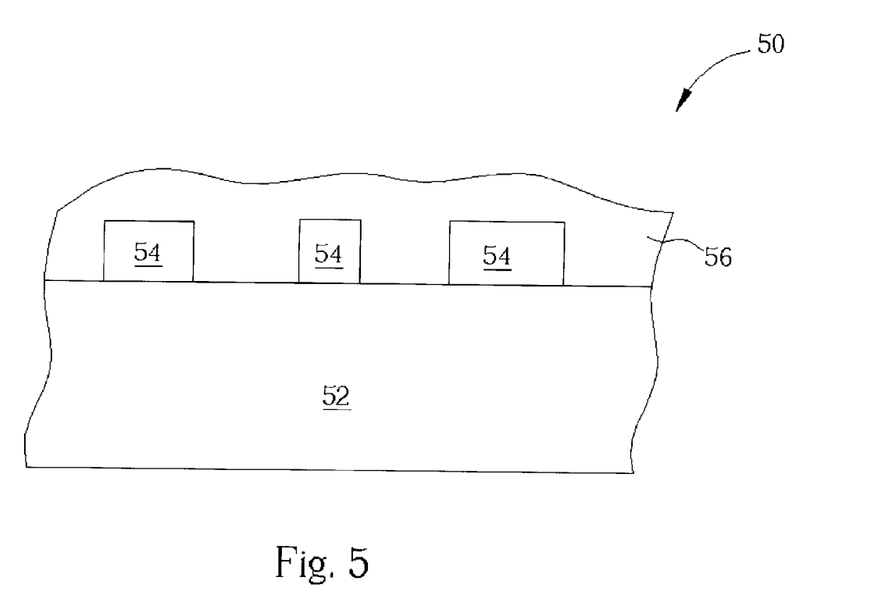
FIG. 5 to FIG. 7 are schematic diagrams for illustrating a re-performable spin-on process according to the first embodiment of the present invention.
Figure 6:
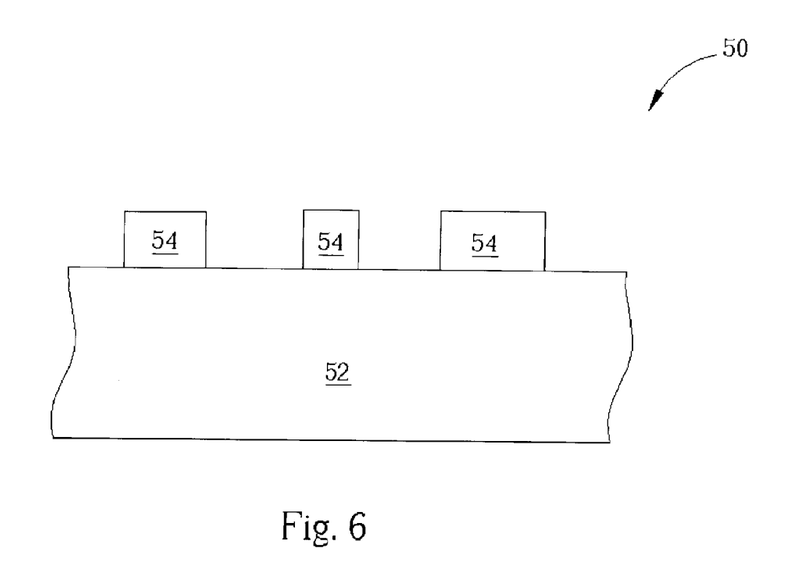
Figure 7:
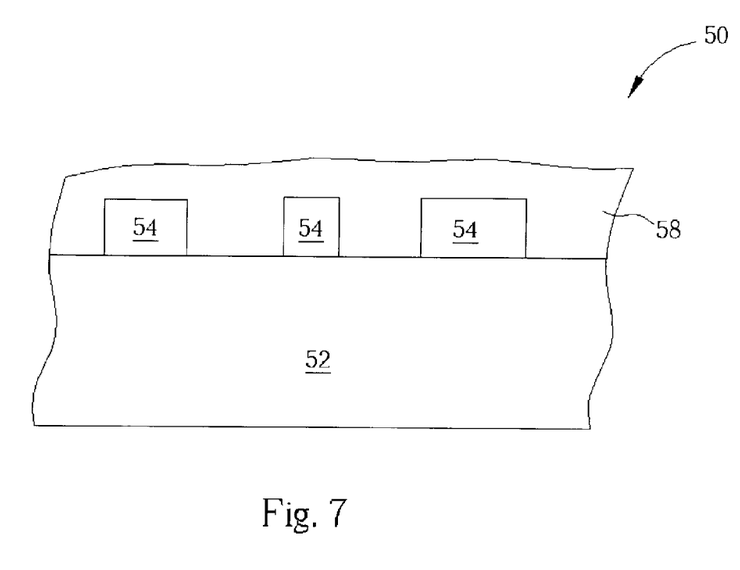

Please refer to FIG. 5 to FIG. 7. FIG. 5 to FIG. 7 are schematic diagrams for illustrating a re-performable spin-on process according to the first embodiment of the present invention. As shown in FIG. 5, a semiconductor wafer 50 is provided, and it includes a silicon substrate 52 and a plurality of metal interconnecting wires 54 formed on the silicon substrate 52. Then, a spin-on process is performed for forming a first dielectric layer 56 over the metal interconnecting wires 54. Additionally, the first dielectric layer 56 is composed of a spin-on glass (SOG) material or a low-k dielectric material such as hydrogen silsesquioxane (HSQ, k=2.8) or methyl silsesquioxane (MSQ, k=2.7).

Thereafter, a measurement of a film thickness and a cleanness inspection are performed on the first dielectric layer 56. As the thickness uniformity of the first dielectric layer 56 is poor or the first dielectric layer 56 is contaminated by chemical solutions or particles due to an edge bevel rinse, a dry etching process is performed for completely removing the first dielectric layer 56. Additionally, an etching gas utilized in the dry etching process can be dichlorodifluoromethane ($CCL_2F_2$), perfluoromethane ($CF_4$), perfluoroethane ($C_2F_6$), or perfluoropropane ($C_3F_8$).

After the first dielectric layer 56 is removed completely, the semiconductor wafer 50 is loaded in a wet scrubber and is cleaned through use of deionized water, as shown in FIG. 6. Then, the semiconductor wafer 50 is dried through use of a heating plate. Finally, the spin-on process is re-performed to form a second dielectric layer 58 over the metal interconnecting wires 54. Likewise, the second dielectric layer 58 is composed of a SOG material or a low-k dielectric material such as HSQ or MSQ. Furthermore, if the thickness uniformity of the second dielectric layer 58 is still poor or the second dielectric layer 58 is contaminated by chemical solutions or particles, the above-mentioned steps can be repeated until a dielectric layer with good thickness uniformity is formed on the semiconductor wafer 50.

Figure 8:
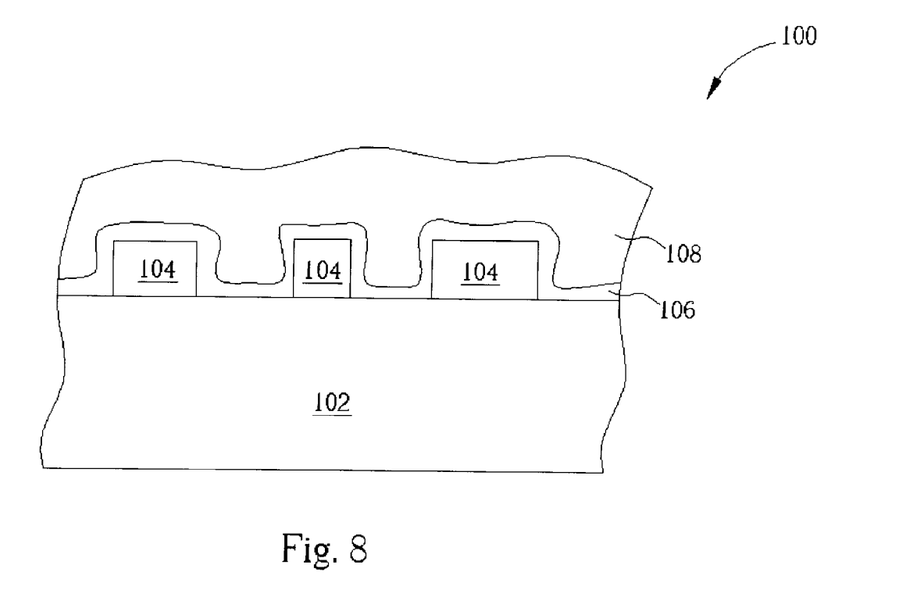
FIG. 8 to FIG. 10 are schematic diagrams for illustrating a re-performable spin-on process according to the second embodiment of the present invention.
Figure 9:
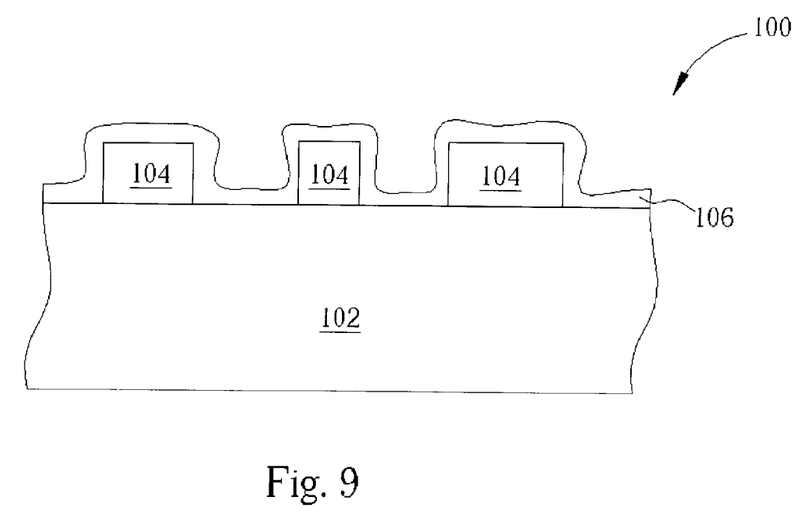
Figure 10:
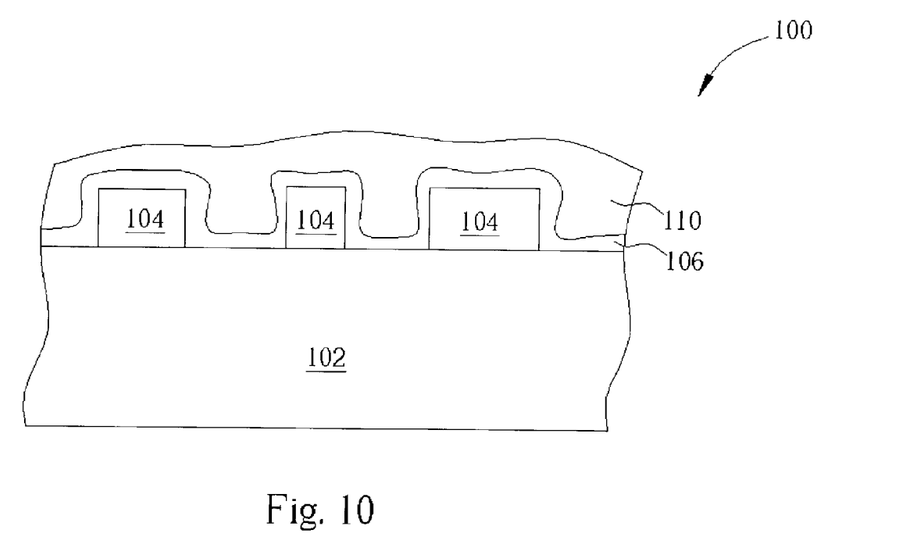

In addition, the present invention can be applied in forming a composite dielectric structure. Please refer to FIG. 8 to FIG. 10. FIG. 8 to FIG. 10 are schematic diagrams for illustrating a re-performable spin-on process according to the second embodiment of the present invention. As shown in FIG. 8, a semiconductor wafer 100 includes a silicon substrate 102, a plurality of metal interconnecting wires 104, and a silicon dioxide layer 106 formed on the semiconductor wafer 100 through performing a PECVD process. Then, a spin-on process is performed for forming a first dielectric layer 108 on the semiconductor wafer 100. Subsequently, a measurement of a film thickness and a cleanness inspection are performed on the first dielectric layer 108. If the thickness uniformity of the first dielectric layer 108 is poor or the first dielectric layer 108 is contaminated by chemical solutions or particles, a wet etching process is performed for completely removing the first dielectric layer 108. An etching solution used in the wet etching process must have a high etching selectivity, which is a ratio of an etching rate for etching the first dielectric layer 108 to an etching rate for etching silicon dioxide layer 106. Usually, the etching solution can be hydrofluoric acid (HF) or buffered hydrofluoric ($HF/NH_4F/H_2O$, BHF). Additionally, the silicon dioxide layer 106 functions as a barrier layer for preventing the metal interconnecting wires 104 from being damaged in the wet etching process. Furthermore, when the first dielectric layer 108 is composed of a SOG material and the BHF solution is used as etching solution, an etching rate for etching the SOG material is about 4500 Å/min and an etching rate for etching the silicon dioxide is about 60 Å/min. Since the etching rate for etching the SOG material is much larger than that for etching the silicon dioxide, the first dielectric layer 108 can be removed completely through use of the wet etching process.

Thereafter, the semiconductor wafer 100 is loaded in a wet scrubber, and particles or etching solutions remaining on the semiconductor wafer 100 are washed away through use of deionized water, as shown in FIG. 9. Then, the semiconductor wafer 100 is dried through use of a heating plate. Finally, the spin-on process is re-performed to form a second dielectric layer 110 over the metal interconnecting wires 104. Likewise, the second dielectric layer 110 can be composed of a SOG material or a low-k dielectric material such as HSQ or MSQ. Furthermore, if the thickness uniformity of the second dielectric layer 110 is still poor or the second dielectric layer 110 is contaminated by chemical solutions, the above-mentioned steps can be repeated until a dielectric layer with good thickness uniformity is formed on the semiconductor wafer 100.

Moreover, the re-performable spin-on process is not limited to forming a composite dielectric structure or a sandwich-type dielectric structure. The present invention can be applied in any kind of semiconductor device that is formed through use of a spin-on process, such as shallow trench isolation.

In comparison with the prior art, the present invention provides a re-performable spin-on process. In thereperformable spin-on process, a spin-on process is first performed for forming a first dielectric layer. Then, an examining step is performed on the first dielectric layer, and the first dielectric layer is made to conform to a predetermined condition. Subsequently, an etching process is performed for completely removing the first dielectric layer. Thereafter, the semiconductor wafer is cleaned through use of a wet scrubber, and is dried. Finally, the spin-on process is re-performed for forming a second dielectric layer on the semiconductor wafer.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A re-performable spin-on process comprising:
   performing a spin-on process for forming a first dielectric layer on a semiconductor wafer, the first dielectric layer being composed of a spin-on glass (SOG) material;
   performing an examining stop on the first dielectric layer, the first dielectric layer conforming to a predetermined condition;
   performing an etching process for completely removing the first dielectric layer;
   cleaning the semiconductor wafer through use of a wet scrubber;
   drying the semiconductor wafer; and
   re-performing the spin-on process for forming a second dielectric layer on the semiconductor wafer, the second dielectric layer being composed of an SOG material;
   wherein the semiconductor wafer comprises a plurality of metal interconnecting wires and the first dielectric layer is formed over the metal interconnecting wires.

2. The process of claim 1 wherein the examining step is a measurement of a film thickness and the predetermined condition indicates poor thickness uniformity of the first dielectric layer.

3. The process of claim 1 wherein the examining step is a cleanness inspection and the predetermined condition indicates that the first dielectric layer is contaminated by chemical solution or particles.

4. The process of claim 1 wherein the first dielectric layer and the second dielectric layer are both composed of a dielectric material having a low dielectric constant.

5. The process of claim 1 wherein the etching process is a dry etching process.

6. The process of claim 1 further comprising forming a barrier layer between the metal interconnecting wires and the first dielectric layer.

7. The process of claim 6 wherein the barrier layer is a silicon oxide layer that is formed through performing a chemical vapor deposition (CVD).

8. The process of claim 1 wherein the etching process is a wet etching process.

9. The process of claim 8 wherein the wet etching process utilizes buffered hydrofluoric (BHF) as an etching solution.

10. A re-performable spin-on process comprising:
   performing a chemical vapor deposition (CVD) process for forming a silicon oxide layer on a semiconductor wafer;
   performing a spin-on process for forming a first dielectric layer on the silicon oxide layer, the first dielectric layer being composed of a spin-on glass (SOG) material;
   performing an examining step on the first dielectric layer, the first dielectric layer conforming to a predetermined condition;
   performing an etching process for completely removing the first dielectric layer;

cleaning the semiconductor wafer through use of a wet scrubber;

drying the semiconductor wafer; and re-performing the spin-on process for forming a second dielectric layer on the semiconductor wafer, the second dielectric layer being composed of an SOG material;

wherein the semiconductor wafer comprises a plurality of metal interconnecting wires and the silicon oxide layer is formed over the metal interconnecting wires.

11. The process of claim 10 wherein the examining step is a measurement of a film thickness and the predetermined condition indicates poor thickness uniformity of the first dielectric layer.

12. The process of claim 10 wherein the examining step is a cleanness inspection and the predetermined condition indicates that the first dielectric layer is contaminated by chemical solution or particles.

13. The process of claim 10 wherein the first dielectric layer and the second dielectric layer are both composed of a dielectric material having a low dielectric constant.

14. The process of claim 10 wherein the etching process is a wet etching process.

15. The process of claim 14 wherein the wet etching process utilizes buffered hydrofluoric (BHF) as an etching solution.

* * * * *